(12) United States Patent
Flake et al.

(10) Patent No.: US 7,188,630 B2
(45) Date of Patent: Mar. 13, 2007

(54) METHOD TO PASSIVATE CONDUCTIVE SURFACES DURING SEMICONDUCTOR PROCESSING

(75) Inventors: John C. Flake, Montbonnot (FR);
Kevin E. Cooper, La Terrasse (FR);
Saifi Usmani, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 183 days.

(21) Appl. No.: 10/431,053

(22) Filed: May 7, 2003

(65) Prior Publication Data

US 2004/0224521 A1 Nov. 11, 2004

(51) Int. Cl.
*B08B 6/00* (2006.01)
*C25F 1/00* (2006.01)
*C25F 3/30* (2006.01)
*C25F 5/00* (2006.01)

(52) U.S. Cl. .................. 134/1.3; 438/690; 438/691; 438/692; 438/693

(58) Field of Classification Search ........ 438/690–693; 134/1.3; 252/79.1–79.5
See application file for complete search history.

(56) References Cited

U.S. PATENT DOCUMENTS

| | | | |
|---|---|---|---|
| 6,074,949 A * | 6/2000 | Schonauer et al. | 438/692 |
| 6,143,705 A * | 11/2000 | Kakizawa et al. | 510/175 |
| 6,251,787 B1 * | 6/2001 | Edelstein et al. | 438/692 |
| 6,274,478 B1 * | 8/2001 | Farkas et al. | 438/626 |
| 6,383,928 B1 * | 5/2002 | Eissa | 438/687 |
| 6,468,910 B1 | 10/2002 | Srinivasan et al. | |
| 6,491,843 B1 | 12/2002 | Srinivasan et al. | |
| 6,503,418 B2 | 1/2003 | Sahota et al. | |
| 6,544,892 B2 | 4/2003 | Srinivasan et al. | |
| 6,627,107 B2 | 9/2003 | Srinivasan et al. | |
| 6,660,638 B1 * | 12/2003 | Wang et al. | 438/692 |
| 6,812,193 B2 * | 11/2004 | Brigham et al. | 510/175 |
| 6,899,821 B2 * | 5/2005 | Uchida et al. | 252/79.1 |
| 2002/0005504 A1 | 1/2002 | Sahota et al. | |
| 2002/0016073 A1 * | 2/2002 | Kondo et al. | 438/691 |
| 2003/0068888 A1 * | 4/2003 | Kodera et al. | 438/687 |
| 2003/0082912 A1 * | 5/2003 | Kezuka et al. | 438/689 |

(Continued)

OTHER PUBLICATIONS

Beverina et al., "Copper Photocorrosion Phenomenon During Post CMP Cleaning," The Electrochemical Society, Inc., Electrochemical and Solid State Letters, pp. 156-158 (2000).

*Primary Examiner*—Duy-Vu N. Deo
(74) *Attorney, Agent, or Firm*—Joanna G. Chiu; Kim-Marie Vo

(57) ABSTRACT

A method for processing semiconductor wafers is disclosed. A solution is applied to a semiconductor wafer to prevent dendrites and electrolytic reactions at the surface of metal interconnects. The solution can be applied during a CMP process or during a post CMP cleaning process. The solution may include a surfactant and a corrosion inhibitor. In one embodiment, the concentration of the surfactant in the solution is less than approximately one percent by weight and the concentration of the corrosion inhibitor in the solution is less than approximately one percent by weight. The solution may also include a solvent and a cosolvent. In an alternate embodiment, the solution includes a solvent and a cosolvent without the surfactant and corrosion inhibitor. In one embodiment, the CMP process and post CMP cleaning process can be performed in the presence of light having a wavelength of less than approximately one micron.

13 Claims, 2 Drawing Sheets

U.S. PATENT DOCUMENTS

2003/0092261 A1* 5/2003 Kondo et al. ............... 438/638
2004/0014319 A1 1/2004 Sahota et al.
2004/0038840 A1* 2/2004 Lee et al. ................... 510/202

* cited by examiner

METHOD TO PASSIVATE CONDUCTIVE SURFACES DURING SEMICONDUCTOR PROCESSING

FIELD OF THE INVENTION

The invention relates generally to a method for forming semiconductor devices, and more specifically, to chemical mechanical processing (CMP).

BACKGROUND

During semiconductor device processing, metal interconnects can act as either anodes or cathodes of an electrolytic cell in the presence of a current source. In the presence of an electrolyte, which occurs during chemical mechanical processing (CMP) when a semiconductor wafer is wet, electrical current can flow from one metal interconnect to another and cause electrolysis. During electrolysis, a metal interconnect can be oxidized (anode) forming ions that may be transported and reduced at another metal interconnect (cathode). The metal that is reduced at the cathode may grow and form a dendrite that leads to electrical shorts between the metal interconnects. The metal that is oxidized at the anode may dissolve leading to voids and electrical opens between the metal interconnects. In either case (shorts or opens) the electrolysis causes circuits to fail and decreases reliability.

The current source needed for electrolysis to occur may arise from several phenomena including thermal or photo-generation of electron-hole pairs (ehp's) at the silicon level. In the presence of photons (e.g., lights) with energies greater than the band-gap for silicon (~1.1 eV), ehp's may be generated and separated at p-n junctions. Under such conditions electrical potentials are favorable for electrolysis at the surface and photogeneration of ehp's acts as the current source. The amount of current is proportional to the area of the p-n junction, relative doping of the p and n regions, and the amount and location of absorbed photons. Ehp's are generated near the surface of a semiconductor wafer depending on the adsorption and extinction co-efficient of the semiconductor wafer. The amount of adsorbed radiation generally follows a Beer's law relationship, decaying exponentially with depth into the surface of the semiconductor wafer. The collection efficiency of these photons (percent of photons leading to electrical current) depends on many factors including: photon energy, dopant types, dopant concentration profiles, recombination rates and generation rates.

One solution to minimize electrolysis (i.e., dendrite formation) is to polish and scrub the semiconductor wafer in darkness to prevent carrier photo-generation such as by turning off the lights in a manufacturing room. While processing the semiconductor wafer in darkness or dim light, may reduce dendrite formation, thermal generation of carriers may allow significant corrosion to occur depending on the structure of the device and the processing environment. In addition, polishing the wafers in a dark or dim environment creates difficulties for operators and engineers to see in the manufacturing room, which increases the risk of accidents, such as dropping and breaking the semiconductor wafer or human injury.

To enable operators and engineers to see in the manufacturing room while still minimizing dendritic formation and growth, the windows of CMP tools or scrubbers can be covered with an opaque material to prevent light from reaching the semiconductor wafer when it is wet and most prone to dendrite formation. However, the opaque material on the CMP tool prevents operators and engineers from viewing the semiconductor wafer during processing to determine if, for example, the semiconductor wafer has stopped being processed or the polishing solution has stopped flowing for unknown reasons. Furthermore, if for some reason it is necessary for the semiconductor wafer to be removed (e.g., if processing stops because the semiconductor wafer is stuck in the CMP tool), once the door of the CMP tool is opened, electrolysis may occur and the semiconductor wafer may suffer reliability problems or yield loss. Therefore, a need exits to overcome the problems of the above processes while minimizing electrolysis and hence formation and growth.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A dendrite minimizing solution including a surfactant and a corrosion inhibitor is applied while rinsing a surface of a semiconductor wafer or after rinsing of the surface. The solution may also include a solvent and a cosolvent. Preferably, the solution is applied to the semiconductor wafer after a plurality of interconnects formed on the semiconductor wafer are electrically isolated along the surface of the semiconductor wafer. The same solution, however, need not be used during or after rinsing. In one embodiment, the semiconductor wafer is dried after applying the solution. The use of the solution in chemical mechanical polishing (CMP) process is described (together with the figures) in more detail below.

Figure 1:
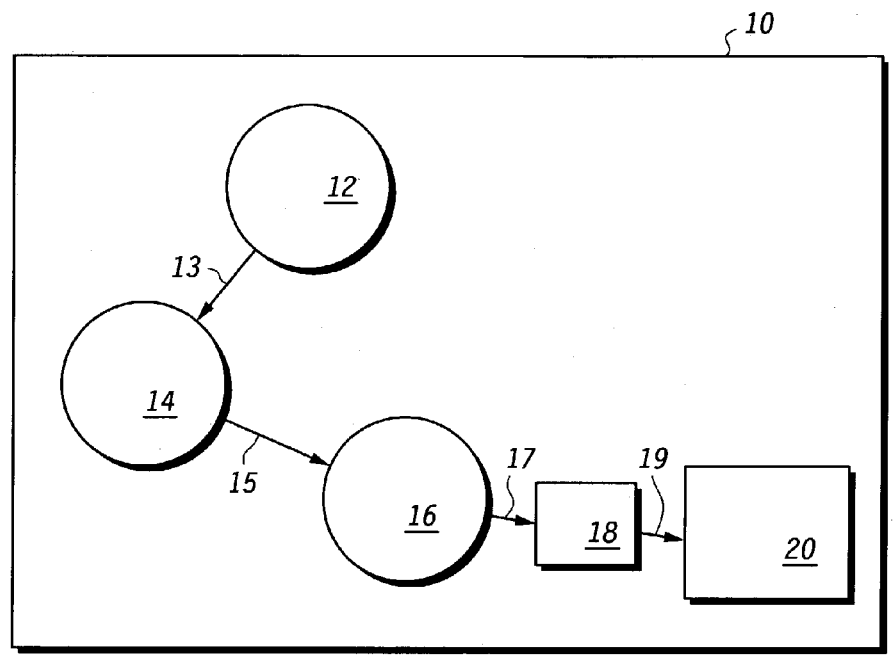
FIG. 1 illustrates a schematic of a chemical mechanical processing (CMP) system used in fabricating a semiconductor wafer in accordance with an embodiment of the present invention.

FIG. 1 illustrates a CMP system 10 having a first platen 12, a second platen 14, a third platen 16, an optional tub 18, and a scrubber or contactless cleaning tool 20. Typically, the first platen 12, the second platen 14, the third platen 16, and the tub 18 are part of the same tool. The CMP system 10 can be divided into CMP processes, which use the first platen 12, the second platen 14, and the third platens 16 and the tub 18, and post-CMP cleaning processes, which use the scrubber 20. The first platen 12, the second platen 14, and the third platen 16 are used to polish or planarize a semiconductor wafer. Optional rinses may be performed after each CMP process to remove particles as not to contaminate subsequent processing. However, the CMP system 10 may have any number of platens. For example, the CMP system 10 may have only one platen, two platens, or more than three platens.

After planarization, the semiconductor wafer is stored in the tub with a liquid, which includes water, until a plurality of semiconductor wafers, such as those stored together in the same wafer box or container, are completed. In one embodiment, the semiconductor wafers are transferred together from the tub 18 to a first station in the scrubber 20, which is the load station and has a liquid, which includes water. One semiconductor wafer at a time from the plurality of semiconductors is removed from the load station manually or by a robot and is placed in a brush box of the scrubber 20, where intermittent mechanical action (brushing) is applied to the semiconductor wafer via a brush to remove particles that were not previously removed after the optional rinsing performed after planarization. After the particles are removed from the semiconductor wafer with a brush, a spin, rinse and dry process is performed to further clean and dry the semiconductor wafer for further processing, which may includes deposition, etching, etc.

In another embodiment, the first, second, third platens 12, 14, and 16 and the scrubber 20 are part of the same tool. In this embodiment, the tub and the load station of the scrubber 20 are not needed to store wafers. In yet another embodiment, the scrubber 20 can be a contactless cleaning tool 20, such as an ultrasonic cleaner that uses a sonic force instead of mechanical action, like the brush box, to remove particles on the semiconductor wafer. To decrease electrolysis and corrosion a surfactant, a corrosion inhibitor, a solvent, and a cosolvent (a solvent that is used in conjunction with another solvent) are used for processing the semiconductor wafer after a final metal removal step, as will be explained in more detail below.

Figure 2:
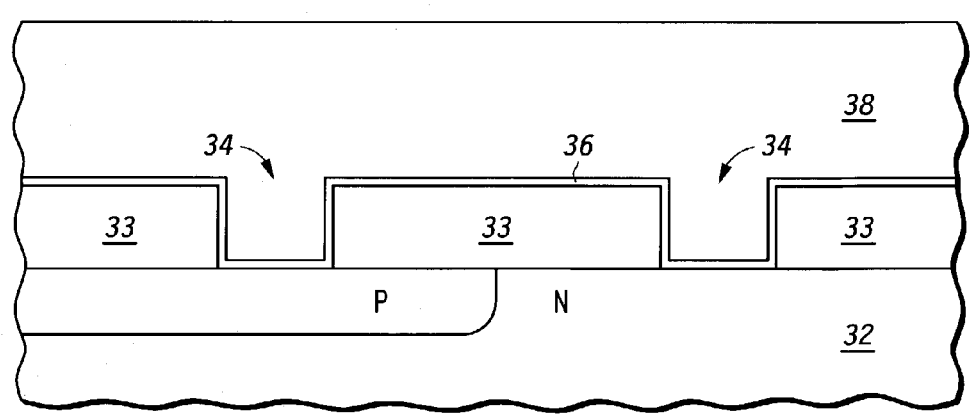
FIGS. 2–5 illustrates a cross-section of a portion of the semiconductor wafer during various processing stages using the CMP system of FIG. 1.
Figure 3:
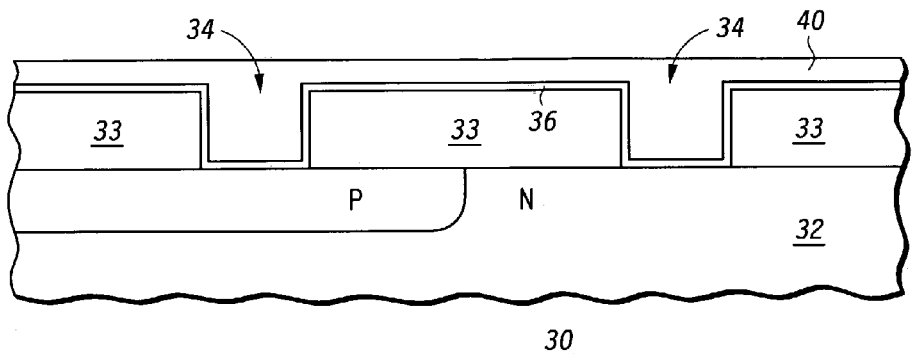

A copper polishing process for forming a copper trench will be described in regards to using the CMP system 10 of FIG. 1 for fabricating a semiconductor wafer 30 of FIGS. 2–5. The semiconductor wafer 30, which has undergone conventional semiconductor processing to form a barrier layer 36 and a conductive layer 38 on the semiconductor substrate 32, as shown in FIG. 2, is provided to the first platen 12 of the CMP system 10. The semiconductor substrate 32 includes recesses 34 formed within an insulating layer 33, which is formed over a P-type region and an N-type region within the semiconductor substrate 32. Although not shown in FIG. 2, the semiconductor substrate 32 may also include layers, such as a dielectric (e.g., silicon dioxide) layer, formed over a semiconductor layer, such as silicon, silicon germanium, gallium arsenide and the like. Portions of the barrier layer 36 and the conductive layer 38 are desirably formed within the recesses 34, while other portions of these layers lie outside the recesses 34 and will be removed using the CMP system 10. In one embodiment, the barrier layer 36 and the conductive layer 38 include tantalum, copper, aluminum, tungsten, silver, titanium, the like, and combinations of the above.

The semiconductor wafer 30 is placed on the first platen 12 to remove a portion of the conductive layer 38. The first platen 12 is used to remove the bulk portion of the conductive layer 38, which is preferably copper, resulting in a thinner conductive layer 40 shown in FIG. 3. For example, the thickness of the conductive layer 38 may be approximately 500–1000 nanometers and the thinner conductive layer 40 may be approximately 10–200 nanometers. In one embodiment, the bulk portion of the conductive layer 38 that is removed is approximately 400–900 nanometers in thickness so that the thinner conductive layer 40 is approximately 100 nanometers.

For polishing the conductive layer 38 using the first platen 12, a CMP slurry including abrasive particles (e.g. aluminum-containing (alumina), ceria-containing (ceria) or silicon-containing (silica) particles), a copper soluble solution or complexing agent (e.g. citric acid), an oxidizing agent (e.g. peroxide), water, and a surfactant (e.g., polyethylene glycol) may be used. Although copper is amphoteric (i.e., soluble in both acid and bases), a complexing agent may be used to make copper-containing ions soluble in the pH range of the CMP slurry, where copper ions are usually insoluble. The first CMP slurry may also include a corrosion inhibitor to prevent aggressive chemical etching of the surface (pitting) and likely includes a biocide to prevent biological growth in the slurry.

Figure 4:
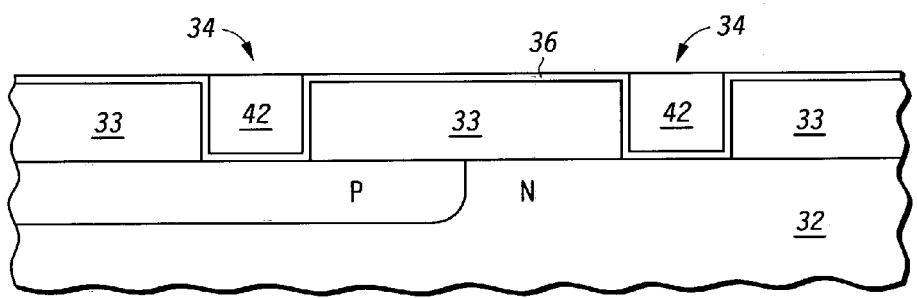
Figure 5:
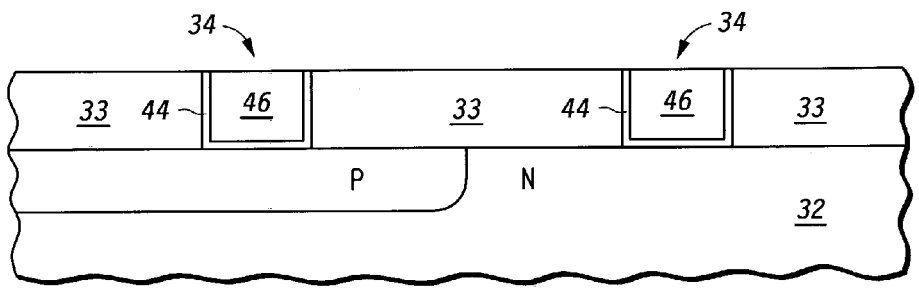

After polishing the conductive layer 38 to form the thinner conductive layer 40, the semiconductor wafer is moved to the second platen 14 manually or by a robot, as shown by arrow 13 in FIG. 1. The second platen 14 is used to remove the portions of the thinner conductive layer 40 that are not within the recesses 34 and form conductive regions 42, as shown in FIG. 4.

Typically, the polishing process using the second platen 14 endpoints on the barrier layer 36, which in some embodiments is approximately 10 to 100 nanometers of tantalum (Ta) or tantalum nitride (TaN). In one embodiment, none of the barrier layer 36 is removed during this process. However, in another embodiment, some portions of the barrier layer 36 may be removed due to differing polishing rates of dense and isolated regions on the wafer. Typically, a similar CMP slurry used with the first platen 12 is used with the second platen 14. Hence, it may be desirable to use the same platen for removing all of the conductive layer 38 and the thinner conductive layer 40 that are not within the recesses 34.

After removing all of the thinner conductive layer 40 that is not within the recesses 34, in one embodiment the semiconductor wafer is transferred manually or automatically (e.g., by robot) to the third platen 16, as shown by arrow 15 in FIG. 1. Typically, a soft buff pad is used to remove the portions of the barrier layer 36 and any sacrificial (or capping) dielectric layer that may have been formed over the insulating layer 33 to form interconnect regions 46 and interconnect barriers 44. Typically, the sacrificial (or capping) dielectric is not a low dielectric constant material, but the exposed surfaces of the insulating layer 33 are a low-dielectric constant material, which decreases resistance of the semiconductor device being formed. Therefore, it is desired that the capping dielectric be removed to minimize resistance.

Once the barrier layer 36 is removed, which occurs during the polishing using the third platen, the interconnect regions 46 are no longer electrically connected to each other along the top surface of the semiconductor wafer (e.g., no conductive region lies over the insulating layer 33) in contrast to the conductive layer 38 and the thinner conductive layer 40. Once the interconnect regions 46 are not electrically connected to each other along the top surface of the semiconductor substrate, the probability of dendrites forming during CMP is increased because the conductive regions 42 are not shorted together therefore allowing current to pass via electrolysis. This is because ambient light is not blocked by conductive layers 38 and 40 and the barrier layer 36 and can travel through the insulating layer 33 to the P-type region and the N-type region thereby initiating photo-generation of electron-hole pairs (ehp's). Thus, the P-type region and the N-type region serve as a current source of an electrolytic cell, wherein the interconnect regions 46 are the anode and the cathode and the CMP slurry is the electrolyte.

In practice during the buff process, portions of the semiconductor wafer are polished at different rates. Thus, in one area of the semiconductor wafer, portions of the barrier layer 36 that lie outside the interconnect regions 46 are already removed thereby allowing light to penetrate to the P-type region and the N-type region, while in other areas the barrier layer 36 is present outside the interconnect region 46. Thus to remove all of the barrier layer 36 outside the interconnect regions 46, some areas of the semiconductor wafer may be polished longer than needed. Thus, the P-type regions and N-type regions that no longer have the barrier layer 36 overlying them are exposed to light during polishing and can form dendrites, which is mitigated by using a dendrite minimizing solution when polishing.

A dendrite minimizing solution including a surfactant, a corrosion inhibitor, a solvent and a cosolvent, a solvent that is different than the other solvent present, can be used. In one embodiment, the surfactant includes polyethylene glycol (PEG), polypropylene glycol (PPG), a block copolymer of polypropylene oxide (PPO) or polyethylene oxide (PEO), ammonium dodecyl sulfate, alkyl phenol ether phosphate, amino ethyl imidazoline, the like or combinations of the above and the corrosion inhibitor includes benzene triazole (BTA), triazole, caffeine, theophylline, bipyridyl, the like or combinations of the above.

In one embodiment, each of the surfactant and the corrosion inhibitor is approximately 100–500 ppm of the dendrite minimizing solution. In a preferred embodiment, the surfactant and the corrosion inhibitor are at most one weight percent (1 wt %) of the dendrite minimizing solution. It is desirable to minimize the total concentration of the surfactant and corrosion inhibitor because they are both organic, which increases the probability of carbon defects on the surface of the semiconductor wafer due to the limited solubility in the dendrite minimizing solution. The presence of the corrosion inhibitor decreases corrosion and dendrite growth. However, using a corrosion inhibitor alone (i.e., without a cosolvent) may result in undesirable defects due to non-homogenous wetting or drying.

The presence of a cosolvent in the dendrite minimizing solution may increase the solubility of the corrosion inhibitor and may increase the adsorption kinetics of the corrosion inhibitor with the interconnect regions 46. Moreover, having a cosolvent of ethylene glycol, methyl alcohol, or another non-polar chemical, and a solvent of water, which is polar, increases wetting of both hydrophobic and hydrophilic surfaces of the wafer. The surfactant also allows for homogeneous wetting of hydrophobic and hydrophilic regions of the wafer surface. These benefits result in a decrease in surface defects during CMP processes and post CMP cleaning.

The solvent and cosolvent used can be water, alcohol, glycols (e.g, ethylene glycol), acetonitrile, acetone, propylene carbonate, and the like, provided that the solvent is different than the cosolvent. For example, if the solvent is water and the cosolvent may be ethylene glycol. In a preferred embodiment, the cosolvent is approximately 0.5 to fifty weight percent (0.5–50 wt %), or more preferably one to ten weight percent (1–10 wt %) of the dendrite minimizing solution.

After buffing, the semiconductor wafer may be rinsed on the third platen 16 to remove any particles remaining on the semiconductor wafer as a result of the CMP process. The solution may also include a biocide. In one embodiment, the corrosion inhibitor is the surfactant and therefore a separate surfactant from the corrosion inhibitor need not be necessary.

The dendrite minimizing solution can be used also during post-CMP cleaning processes, as will be described below, but the chemistries and concentrations need not be the same for all processes. After rinsing the wafer, it may be transferred manually or by a robot from the third platen 16 to the tub 18 as illustrated by the arrow 17 and then in conjunction with other semiconductor wafers to the scrubber 20 as illustrated by the arrow 19 in FIG. 1. Alternatively, the wafer is transferred from the third platen 16 to the scrubber 20 directly. In yet another embodiment, the scrubber 20 is a contactless cleaning tool 20 and thus the semiconductor wafer can be transferred from the third platen 16 to the contactless cleaning tool 20. The solutions in the tub 18, all portions of the scrubber (i.e., the load station, the brush box, and the spin-rinse-dry process) 20, or the ultrasonic cleaner may include the dendrite minimizing solution.

However, the dendrite minimizing solution used in the brush box of the scrubber may also include another chemical, such as citric acid, to adjust a zeta potential of abrasive particles. The zeta potential indicates the surface charge existing on the surface of the wafer or abrasive particle. Depending on the abrasive and the surface of the wafer, zeta potentials may be manipulated in solutions to increase repulsive forces between particles and the surface. The zeta potential can also be used to predict and control the stability of the abrasive. As the zeta potential of abrasive particles increases, the probability of aggregation decreases.

The dendrite minimizing solution can be used for any process described above. The dendrite minimizing solution can be applied by submerging the semiconductor wafer into the dendrite minimizing solution, spraying the dendrite minimizing solution onto the semiconductor wafer, or pouring the dendrite minimizing solution onto the wafer, the like, or combinations of the above. Preferably, when applying the dendrite minimizing solution while polishing the semiconductor wafer on a platen, the dendrite minimizing solution is sprayed and when applying the dendrite minimizing solution during post-CMP cleaning process the semiconductor wafer is submerged into the dendrite minimizing solution in a scrubber, for example. Furthermore, it may be desirable to use the dendrite minimizing solution in other wet processes where the potential to form dendrites and defects is present. The dendrite minimizing solution can be used in conjunction with any other process for minimizing dendrites or defects. For example, the lights can be shut off or dimmed when using the dendrite minimizing solution or can be left on in the manufacturing room. Experiments have shown that the use of the dendrite minimizing solution with processes performed in the CMP system 10 starting with the third platen 16 to the spin-rinse-dry process sufficiently reduces dendrite formation in full ambient lighting. In other words, all processing can be performed in the presence of light having a wavelength less than approximately one (1) micron and still decrease dendrite growth. Experiments have also been performed using the dendrite minimizing solution in conjunction with the semiconductor wafer on the second platen 14, which is possible, but did not result in having a significant effect on dendrite growth and therefore is not preferred as it unnecessarily increases the cost of the solution used on the second platen 14.

Based on the above discussion, a skilled artisan should recognize that using a dendrite minimizing solution of a surfactant, corrosion inhibitor, solvent and cosolvent during CMP, especially those processes performed after the interconnects are electrically isolated from each other on the surface of the semiconductor wafer (i.e, the conductive material not within recesses is removed) reduces dendrite growths (viz. electrolysis). The solution also decreases corrosion on metal surfaces that are not part of an electrolytic cell by preventing surface oxidation and thus increasing yield by eliminating defects within the interconnects. Another benefit is increased reliability and electromigration resistance. The interconnect-dielectric interface is known as a fast diffusion pathway for copper, an element that may be used in the interconnect, and added defects (such as carbon or copper oxides) may lead to early stress failures (voids) and limited device lifetimes.

In the foregoing specification, the invention has been described with reference to specific embodiments. However, one of ordinary skill in the art appreciates that various modifications and changes can be made without departing from the scope of the present invention as set forth in the claims below. For example, although the invention has been described with respect to specific conductivity types, skilled artisans appreciated that conductivity types may be reversed. Although the figures shown two interconnect regions, any number of interconnect regions may be formed. In addition, other suitable barrier and interconnect materials can be used and any number of interconnect barrier layers or interconnect materials can be used. For example, the interconnect barrier layers can be made of multiple layers of different materials. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for processing semiconductor wafers, comprising:
    rinsing a surface of a semiconductor wafer having a plurality of conductive interconnects, wherein the plurality of the conductive interconnects are electrically isolated along the surface of the semiconductor wafer;
    applying a solution to the semiconductor wafer, wherein the solution comprises a surfactant and a corrosion inhibitor and is applied during rinsing or after the rinsing of the surface of the semiconductor wafer; and
    drying the semiconductor wafer after applying the solution to the semiconductor wafer, wherein at least one of the rinsing and the drying is performed in the presence of light having a wavelength of less than approximately one micron.

2. The method of claim 1, wherein the solution is applied during and after the rinsing of the surface of the semiconductor wafer.

3. The method of claim 1, wherein the rinsing is performed during a chemical mechanical polishing (CMP) process.

4. The method of claim 3, wherein the drying is performed during a post CMP clean.

5. The method of claim 1, wherein the surfactant comprises one of polyethylene glycol (PEG), polypropylene glycol (PPG), a block copolymer of polypropylene oxide (PPO) or polyethylene oxide (PLO), ammonium dodecyl sulfate, or alkyl phenol ether phosphate, amino ethyl imidazoline.

6. The method of claim 1, wherein the corrosion inhibitor comprises one of benzene triazole (BTA), triazole, caffeine, theophylline, or bipyridyl.

7. The method of claim 1, wherein the solution further comprises a solvent selected from a group consisting of alcohol, glycol, and acetone.

8. The method of claim 1, wherein both the rinsing and the drying are performed in the presence of light having a wavelength of less than approximately one micron.

9. The method of claim 1, wherein the plurality of the conductive interconnects comprise a conductive material selected from a group consisting of copper, aluminum, tungsten, silver, tantalum, and titanium.

10. The method of claim 1, wherein the surfactant comprises the corrosion inhibitor.

11. The method of claim 1, wherein applying the solution comprises at least one of submerging the semiconductor wafer into the solution, spraying the solution onto the semiconductor wafer, or pouring the solution onto the semiconductor wafer.

12. The method of claim 1, wherein a concentration of the surfactant in the solution is less than approximately one percent by weight.

13. The method of claim 1, wherein a concentration of the corrosion inhibitor in the solution is less than approximately one percent by weight.

* * * * *

UNITED STATES PATENT AND TRADEMARK OFFICE
CERTIFICATE OF CORRECTION

PATENT NO. : 7,188,630 B2 Page 1 of 1
APPLICATION NO. : 10/431053
DATED : May 7, 2003
INVENTOR(S) : John C. Flake et al.

It is certified that error appears in the above-identified patent and that said Letters Patent is hereby corrected as shown below:

In Column 8, Line 16, Claim No. 5:
    Change "(PLO)" to --(PEO)--

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,188,630 B2  Page 1 of 1
APPLICATION NO. : 10/431053
DATED : March 13, 2007
INVENTOR(S) : John C. Flake et al.

It is certified that error appears in the above-identified patent and that said Letters Patent is hereby corrected as shown below:

In Column 8, Line 16, Claim No. 5:
    Change "(PLO)" to --(PEO)--

This certificate supersedes Certificate of Correction issued November 6, 2007.

Signed and Sealed this

Twenty-seventh Day of November, 2007

JON W. DUDAS
*Director of the United States Patent and Trademark Office*